(12) United States Patent
Ausserlechner

(10) Patent No.: US 10,094,889 B2
(45) Date of Patent: Oct. 9, 2018

(54) SYSTEMS AND ARRANGEMENTS OF THREE-CONTACT HALL-EFFECT DEVICES AND RELATED METHODS

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/699,560

(22) Filed: Sep. 8, 2017

(65) Prior Publication Data

US 2017/0371004 A1 Dec. 28, 2017

Related U.S. Application Data

(62) Division of application No. 14/546,820, filed on Nov. 18, 2014, now Pat. No. 9,766,303.

(51) Int. Cl.
*G01R 33/07* (2006.01)
(52) U.S. Cl.
CPC .................. *G01R 33/077* (2013.01)
(58) Field of Classification Search
CPC ......... H01L 43/08; H01L 43/02; H01L 43/10; H01L 43/12; H01L 27/222; H01L 27/228; H01L 2924/00; G11C 11/161; G11C 11/1675; G01D 5/145; G01R 19/0092; G01R 15/183; G01R 33/07; G01R 15/18
See application file for complete search history.

(56) References Cited

U.S. PATENT DOCUMENTS

| | | | |
|---|---|---|---|
| 3,668,670 A | 6/1972 | Andersen | |
| 9,091,565 B2 | 7/2015 | Kawano et al. | |
| 9,310,446 B2 | 4/2016 | Kubik | |
| 2007/0029999 A1 | 2/2007 | Middelhoek et al. | |
| 2007/0096228 A1 | 5/2007 | Ahn et al. | |
| 2007/0290682 A1* | 12/2007 | Oohira | G01R 33/07 324/251 |
| 2013/0021026 A1 | 1/2013 | Ausserlechner | |

(Continued)

FOREIGN PATENT DOCUMENTS

CN 1669159 A 9/2005
CN 102881818 A 1/2013
(Continued)

OTHER PUBLICATIONS

Office Action dated Feb. 11, 2018 for Chinese Patent Application No. 201510795648.7.

(Continued)

*Primary Examiner* — Alesa Allgood
(74) *Attorney, Agent, or Firm* — Schiff Hardin LLP

(57) ABSTRACT

Embodiments relate to vertical Hall effect devices comprising Hall effect structures with three contacts in each Hall effect region. In one embodiment, the contacts are interconnected with terminals such that the Hall effect device has symmetry and nominally identical internal resistances in the absence of externally applied magnetic fields. Embodiments are capable of operating in multiple operating phases, such that spinning can be used to measure field redundantly and improve magnetic field measurement accuracy.

7 Claims, 9 Drawing Sheets

(56) References Cited

U.S. PATENT DOCUMENTS

| | | | |
|---|---|---|---|
| 2013/0127453 A1* | 5/2013 | Ausserlechner | ....... G01R 33/07 |
| | | | 324/251 |
| 2013/0342196 A1 | 12/2013 | Ausserlechner | |
| 2014/0084911 A1* | 3/2014 | Ausserlechner | ....... G01R 33/07 |
| | | | 324/251 |
| 2014/0210461 A1 | 7/2014 | Ausserlechner | |
| 2015/0022192 A1 | 1/2015 | Ausserlechner | |

FOREIGN PATENT DOCUMENTS

| | | |
|---|---|---|
| CN | 103777154 A | 5/2014 |
| DE | 10150950 C1 | 6/2003 |
| DE | 102006061883 A1 | 8/2007 |
| DE | 102009015965 A1 | 10/2009 |
| DE | 102011107767 A1 | 1/2013 |
| DE | 102012212594 A1 | 11/2013 |
| DE | 102015208430 A1 | 11/2015 |
| EP | 1438755 A2 | 7/2004 |
| WO | 03/036732 A2 | 5/2003 |

OTHER PUBLICATIONS

Office Action dated Jan. 12, 2018 for Germany Application No. 102015119945.9.

\* cited by examiner

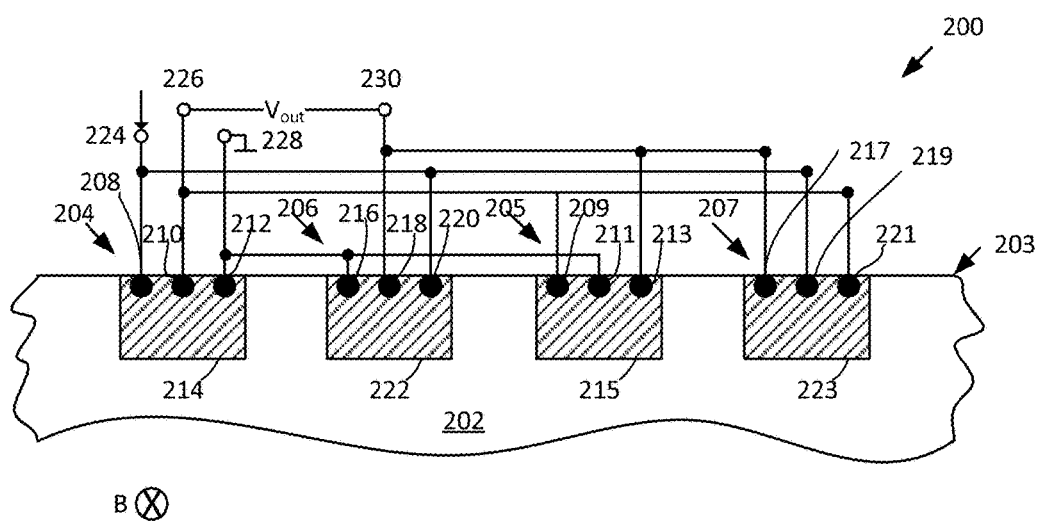

SYSTEMS AND ARRANGEMENTS OF THREE-CONTACT HALL-EFFECT DEVICES AND RELATED METHODS

TECHNICAL FIELD

Embodiments relate to magnetic field sensors. More particularly, embodiments relate to arrangements and configurations of Hall effect sensors.

BACKGROUND

Hall effect sensors are used in a variety of systems to measure magnetic field. Hall effect sensors use the Hall effect, whereby a voltage is generated across a conductor or semiconductor due to Lorentz forces on moving charge carriers. This voltage, called the Hall voltage, can be measured to ascertain the strength of the applied magnetic field. The Hall voltage is inversely proportional to the density of charge carriers. Accordingly, Hall effect devices are often made of a semiconducting material with relatively lower charge carrier density than conductors.

Hall effect sensors can be either vertically or horizontally oriented in a semiconductor die. Horizontal Hall effect devices, also called Hall plates, respond to a magnetic field component perpendicular to the main surface of the die in which they are formed. In contrast, vertical Hall effect devices respond to a magnetic field component parallel to the main surface of the die.

Hall effect sensors can be either vertically or horizontally oriented in a semiconductor chip or die. Horizontal Hall effect devices, also called Hall plates, respond to a magnetic field component perpendicular to the main surface of the die in which they are formed. In contrast, vertical Hall effect devices respond to a magnetic field component parallel to the main surface of the die.

Four-contact and three-contact Hall effect devices are known. In a four-contact device, power (such as a supply current) is driven from a first contact to a second contact (usually positioned opposite the Hall effect device from the first contact along a primary axis). Third and fourth contacts are positioned to measure the Hall voltage generated by the current flow under the action of a magnetic field, and are likewise usually positioned opposite the Hall effect device from one another along a secondary axis. Third and fourth contacts are positioned such that in the absence of magnetic field they are at the same potential. This is often achieved by arranging primary and secondary axes perpendicular to one another.

In a three-contact device, power (such as a supply current) is driven from a first contact to a second contact. The voltage at a third contact is a function of not only the power supplied, but also of any magnetic field incident upon the Hall effect device in a direction in which that device is sensitive. Three-contact devices can be arranged vertically (e.g., with contacts arranged substantially along a line) or horizontally (e.g., a Hall plate in which the contacts are arranged coplanar with one another and not along a line).

The roles of the contacts (e.g., supply or signal contacts) in a three-contact vertical Hall effect device can be permuted to operate the Hall effect device in different operating phases. This permutation is referred to as spinning. Various offsets are produced during spinning operation. Within a given operating phase, at zero applied magnetic field, a signal voltage can be observed, referred to as "raw offset." By spinning the Hall effect device and combining the resultant signal voltages, some of the raw offset can be corrected. The remainder is referred to as "residual offset." "Electric offset" is the part of the offset that can be modeled by an equivalent resistor model of the Hall-effect device and switches. "Thermo-offset" refers to offset errors due to thermal effects such as Seebeck and Peltier effects occurring in the Hall effect device.

Generally speaking, spinning schemes for Hall effect devices attempt to produce high magnetic sensitivity, while reducing residual offset of the system. During spinning, equal current is injected into the device in all operating phases. However, since the device has different internal resistance in various operating phases, the supply voltage is different for each phase. This is a disadvantage, because voltage headroom must be provided in the circuit, and power is unnecessarily dissipated in the system.

SUMMARY

In an embodiment, a sensor system comprises a first Hall effect structure comprising first, second, and third contacts arranged non-linearly at or near the top surface of a first Hall effect region. A resistance of the first Hall region between the first contact and the third contact is substantially the same as a resistance of the first Hall region between the second contact and the third contact in the absence of a magnetic field. The system further includes a second Hall effect structure having fourth, fifth, and sixth contacts arranged non-linearly at or near a top surface of a second Hall effect region, and a resistance between the fourth contact and the sixth contact is substantially the same as a resistance through the second Hall effect region between the fifth contact and the sixth contact in the absence of a magnetic field. The system further comprises a set of interconnections. These interconnections include a first terminal connected to the first and sixth contacts, a second terminal connected to the second contact, a third terminal connected to the third and fourth contacts, and a fourth terminal connected to the fifth contact.

According to another embodiment, a sensor system comprises a first Hall effect structure comprising a first Hall effect region and first, second, and third contacts arranged at or near a top surface of the first Hall effect region, a second Hall effect structure comprising a second Hall effect region and fourth, fifth, and sixth contacts arranged at or near a top surface of the second Hall effect region, a third Hall effect structure having a third Hall effect region and seventh, eighth, and ninth contacts arranged at or near a top surface of the third Hall effect region, and a fourth Hall effect structure having a fourth Hall effect region and tenth, eleventh, and twelfth contacts arranged at or near a top surface of the fourth Hall effect region, wherein the first, second, third and fourth Hall effect regions comprise the same type of majority carriers. The first, sixth, and eleventh contacts are electrically coupled to a first terminal, the second, seventh, and twelfth contacts are electrically coupled to a second terminal, the third, fourth, and eighth contacts are electrically coupled to a third terminal, and the fifth, ninth, and tenth contacts are electrically coupled to a fourth terminal.

According to another embodiment, a method of sensing a magnetic field using a sensor system is described. The sensor system comprises a first Hall effect structure having first, second, and third contacts arranged non-linearly adjacent to a first Hall effect region. The sensor system further comprises a second Hall effect structure having fourth, fifth, and sixth contacts arranged non-linearly adjacent to a second Hall effect region. The method further includes operating the sensor system in a first operating phase, by injecting current at a first terminal connected to the first and sixth contacts, holding a second terminal connected to the third and fourth contacts at a constant voltage, measuring a first output voltage, measuring a second output voltage at a fourth terminal connected to the fifth contact, and combining the first voltage and the second voltage to generate a first operating phase output. The method further includes operating the sensor system in a second operating phase by injecting current at the third terminal, holding the fourth terminal at a constant voltage, measuring a third output voltage at the first terminal, measuring a fourth output voltage at the second terminal, and combining the third voltage and the fourth voltage to generate a second operating phase output. The method further comprises combining the first operating phase output and the second operating phase output to generate a sensor output, whereby first and second operating phase outputs respond to the same component of a magnetic field.

BRIEF DESCRIPTION

Embodiments may be more completely understood in consideration of the following detailed description and in connection with the accompanying drawings, in which:

FIGS. 2A-2B are cross-sectional views of a system according to an embodiment that includes four Hall effect structures in first and second operating phases, respectively.

Figure 1A:
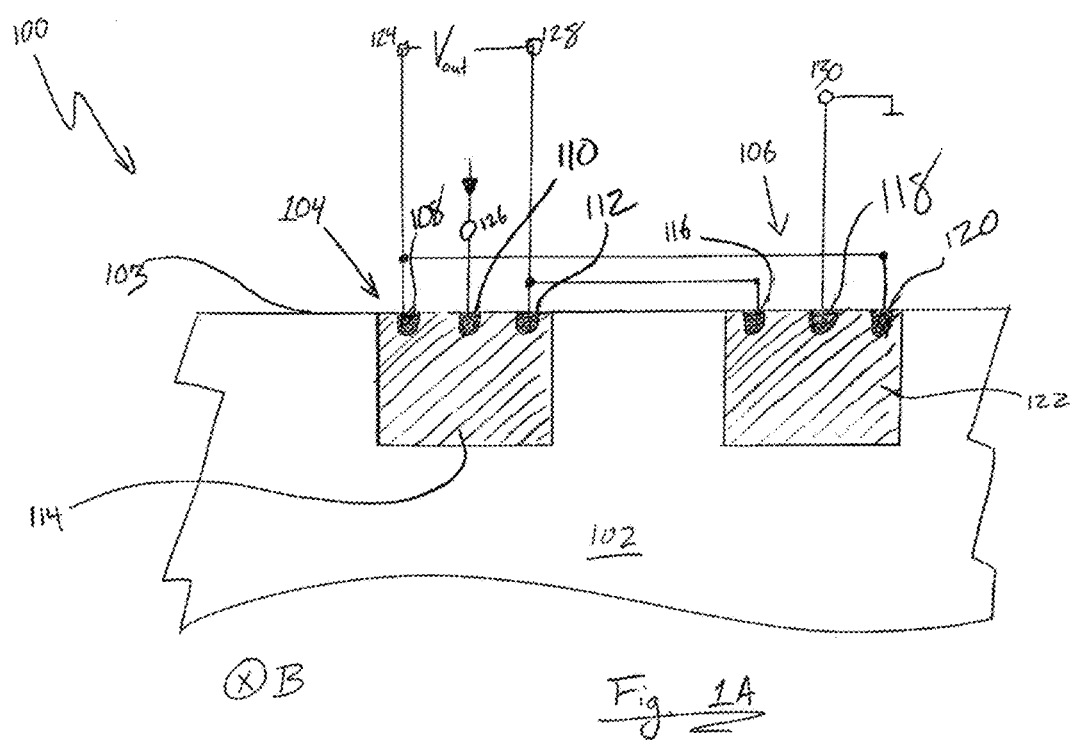
FIGS. 1A-1B are cross-sectional views of a system according to one embodiment that includes two Hall effect structures, each having three contacts and a Hall effect region, in first and second operating phases, respectively.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

As shown in the figures and discussed below, a Hall effect device is designed that has symmetry to address the problem of different internal resistances in various phases when operated in a spinning scheme discussed herein. Three-contact Hall effect devices are described herein that are operable in multiple operating phases. The devices described below have nominally equal resistances in each of the operating phases, which promotes accuracy of field strength measurements while minimizing required current draw to the sensors.

Referring to FIG. 1A, an example of a sensor system 100 is depicted. Sensor system 100 comprises substrate 102 with a surface 103. First Hall effect structure 104 and second Hall effect structure 106 are arranged in substrate 102. First Hall effect structure 104 and second Hall effect structure 106 each include three contacts as well as a Hall effect region. In particular, first Hall effect structure 104 includes contacts 108, 110, and 112 arranged in or close to the top surface 103 of the substrate 102 and arranged in first Hall effect region 114, and second Hall effect structure 106 includes contacts 116, 118, and 120 arranged in or close to the top surface 103 of the substrate 102 and arranged in second Hall effect region 122. Terminals 124, 126, 128, and 130 are connected to contacts 108, 110, 112, 116, 118, and 120. In particular, first Hall effect structure 104 and second Hall effect structure 106 are interconnected such that contact 108 and contact 120 can be held at a common voltage and connected to terminal 124. Contact 110 is connected to terminal 126. Contacts 112 and 116 can also be held at a common voltage, and are connected to terminal 128. Contact 118 is connected to terminal 130. In the embodiment shown in FIG. 1A, an output voltage between terminal 124 and terminal 128 is depicted as $V_{out}$. A magnetic field is applied to sensor system 100, labeled B. Each of the terminals are permanently connected to their associated contacts, wherein a permanent connection is one in which there is a low ohmic connection, even if the devices is not supplied with electrical power.

In various embodiments, substrate 102 can comprise a substrate, a semiconductor die, a leadframe coupled with one or more semiconductor dies, a component board, a combination or portion thereof or some other support structure capable of establishing and/or maintaining an accurate or relative placement of first Hall effect structure 104 and second Hall effect structure 106 with respect to each other and/or at least one other component. For example and simplicity, the term "substrate" will generally be used herein throughout but is not limiting with respect to all embodiments and/or the scope of the claims. In some embodiments, substrate 102 can be a semiconductor substrate (e.g., silicon) and Hall-effect regions 114 and 122 can be regions with low doping (about $1 \times 10^{15}$-$5 \times 10^{17}$/cm$^3$).

In various embodiments, Hall effect structures 104 and 106 can be arranged on a single substrate (e.g., substrate 102) or on separate substrates. Substrate 102 can further be arranged in or on a die, a sensor package, or another structure in various embodiments. In some embodiments, Hall effect regions 114 and 122 comprise semiconductor material having the same type of conductivity, (i.e. both having n-type majority carriers, or alternatively p-type). In those embodiments in which a higher charge carrier mobility is desired, n-type may be used rather than p-type. Various alternative Hall effect structures, sensors, and systems are described, for example, in U.S. patent application Ser. No. 13/627,468 by the same inventor, the content of which is incorporated by reference in its entirety. The interconnections and operating phases associated with systems and structures described herein can, in many embodiments, be implemented on those alternative Hall effect structures. To the extent of any inconsistency or conflict in the definition or use of terms between any of the incorporated publications, documents or things and the present application, those of the present application shall prevail.

First Hall effect structure 104 and second Hall effect structure 106 are vertical Hall structures, such that the output signal of sensor system 100 is responsive to a magnetic field component parallel to the top surface 103 of substrate 102, and perpendicular to the current flow direction through Hall effect regions 114 and 122. In other words, Hall effect structures 104 and 106 are configured to sense magnetic field components directed into the page, as illustrated by the conventional symbol for flux into the page in this embodiment, although other arrangements, configurations or orientations can be implemented in other embodiments. With increasing strength of magnetic field B, the Lorentz force on charge carriers flowing downwards from one of contacts 108, 110, or 112 into Hall effect region 114 increases proportionally. Likewise, with increasing strength of magnetic field B, the Lorentz force on charge carriers flowing downwards from one of contacts 116, 118, or 120 into Hall effect region 122 increases proportionally.

The two Hall effect regions 114 and 122 can be electrically isolated from one another, except for the connections between the contacts. In some embodiments, the two Hall effect regions 114 and 122 can be part of the same "tub," and there can be a spacing between them that is larger than the depth of the tub, or some other kind of decoupling (such as a shallow or deep reverse-biased tub). Moreover, the two Hall effect regions 114 and 122 can be electrically coupled to one another by a buried layer, as described in more detail with respect to the embodiment shown, for example, at FIG. 3. In those embodiments, the buried layer can have the same type of doping as the associated Hall effect regions, but at a higher doping level to achieve a higher level of conductivity. In some embodiments, the conductivity of the buried layer can have 10 times higher conductivity or more than the Hall effect regions. Furthermore, the two Hall effect regions 114 and 122 can, in alternative embodiments, have different sizes, geometries, or aspect ratios than those shown in the embodiments of FIGS. 1A and 1B. The Hall effect regions 114 and 122, in various alternative embodiments, can be aligned or angled relative to one another to sense magnetic field components in various directions.

The contacts 108, 110, 112, 116, 118, and 120 are regions within Hall effect structures 104 and 106 that facilitate the ingress and egress of electrical supply to the respective Hall effect regions 114 and 122 via supply contacts, as well as measurement of the voltage at various locations in the Hall effect regions via signal contacts. The role each of contacts 108, 110, 112, 116, 118, and 120 can vary depending on the spinning state of the sensor system 100.

In some embodiments, contacts 108, 110, 112, 116, 118, and 120 can be ohmic contacts (in contrast to, for example, Shottky contacts), which can be implanted or diffused with a higher dose of dopant than the surrounding Hall effect region 114 or 122. Often, contacts 108, 110, 112, 116, 118, and 120 have at least 10 times higher dose of dopant, and at least $10^{17}$ charge carriers/cm$^3$. Contacts can be formed by stacking, from top to bottom, aluminum or copper wire; then a tungsten plug, then a contact tub, which is often a shallow n+S/D-diffusion (a heavily n-doped source-drain diffusion of, for example, 200 nm depth). There may be additional layers in between those three layers previously described configured to prevent inter-layer diffusion. Such wires can be formed in the interconnect layer during a semiconductor manufacturing process. In embodiments, the wires can have rectangular cross-sections, with a thickness of about 500 nm to about 2 μm, and a width that can be scaled in a range of about 500 nm to about 500 μm. Such wires can have the appearance of flat layers. The contacts 108, 110, 112, 116, 118, and 120 can be symmetric relative to the Hall effect region 114 or 122 in which they are positioned, but in alternative embodiments (e.g., the embodiments shown in FIG. 4) they may be asymmetrically arranged.

Figure 1B:
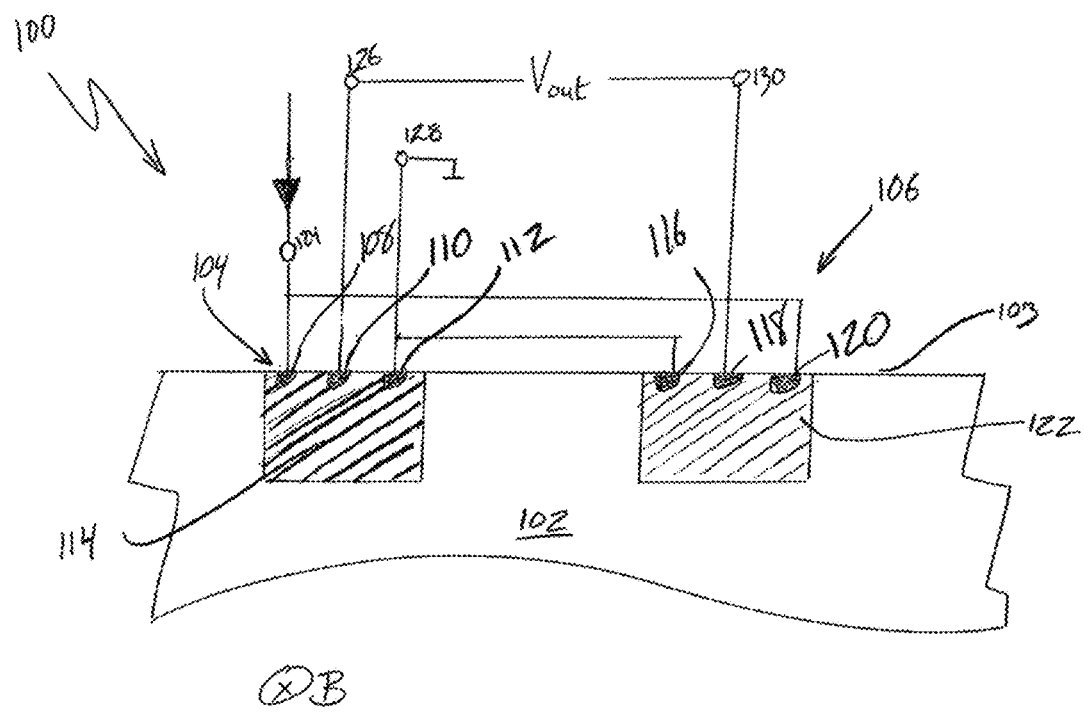

Contacts 108, 110, 112, 116, 118, and 120 are each arranged along a surface of the substrate 102 in which they are arranged. Often, as shown in FIGS. 1A and 1B, surface 103 of the substrate 102 is the same as the surface of each Hall effect region (114, 122) along which the contacts (108, 110, 112, 116, 118, and 120) are arranged. However, in alternative embodiments, such as those in which the Hall effect regions are arranged in different substrates from one another, the contacts need not all be arranged along a common surface (e.g., 103).

Contacts 108, 110, and 112 are arranged to facilitate electrical current in a current flow direction that is perpendicular to the magnetic field B in the first Hall effect region 114, while contacts 116, 118, and 120 are arranged to facilitate electrical current in a current flow direction that is perpendicular to the magnetic field B in the second Hall effect region 122. In the embodiment shown in FIG. 1A, and in operation, current is injected into contact 110 by a constant current source at terminal 126. Terminal 130 is connected to ground. The injected current thus has two paths to ground: a rightward-traveling current path and a leftward-traveling current path. In the rightward-traveling current path, current flows from contact 110 to contact 112 through first Hall effect region 114, then from contact 116 to contact 118 through second Hall effect region 122. In the leftward-traveling current path, current flows from contact 110 to contact 108 through first Hall effect region 114 and then from contact 120 to contact 118 through second Hall effect region 122.

In the configuration shown in FIG. 1A, current will predominantly follow the rightward-traveling current path. Injected current resulting from providing voltage or current supply at terminal 126 (as indicated by the arrow) is downwards with respect to FIG. 1A, and the magnetic field (into the page) points into the page, with respect to FIG. 1A. Thus, the Lorentz force qv×B shifts the charge carriers to the right, with respect to FIG. 1A, and current along the rightward-traveling current path is increased. For the same reason, current flow from contact 110 to contact 108 along the leftward-traveling current path will be reduced. This results in imbalance in electric potential between terminals 124 and 128. Contact 112 is electrically connected to contact 116, and current can again flow to the right with respect to FIG. 1A from contact 116 to contact 118 and ground.

Due to the current flow pattern described above, the voltage at terminal 128 will be greater than the voltage at terminal 124 in the embodiment illustrated in FIG. 1A. As the magnitude of the magnetic field increases this voltage difference will also increase, and so the magnitude of the voltage difference between terminals 124 and 128 can be used to ascertain the magnitude of the magnetic field B.

The interconnection of contacts 108, 110, 112, 116, 118, and 120 with terminals 124, 126, 128, and 130 allows for measurement of magnetic field B as described above, referred to hereinafter as the first operating phase. However, the functions of terminals 124, 126, 128, and 130 can be interchanged such that measurement of the magnetic field is measured in a different way, referred to hereinafter as the second operating phase and described in more detail with respect to FIG. 1B. Switching between these operating phases is a process referred to as "spinning." Spinning of sensor system 100 reduces residual offset and requires low current consumption, while providing high magnetic sensitivity.

Using only a single operating phase (such as the operating phase described with respect to FIG. 1A), there is often a small asymmetry due to manufacturing tolerances, contact placements, etc., such that the output voltage (e.g., the difference in potential between contacts 124 and 128) is non-zero even at a zero magnetic field. This output is referred to as the zero point error or "raw offset." By additionally operating in a second phase, this raw offset can be at least partially cancelled out. In some embodiments, the residual raw offset obtained while spinning in multiple operating phases can be orders of magnitude smaller than the raw offset obtained using only a single operating phase.

FIG. 1B shows the same embodiment of sensor system 100 as FIG. 1A, but the terminals have been reconfigured to measure magnetic field B in a second operating phase. In the configuration shown in FIG. 1B, contacts 108 and 120 are supply contacts (as indicated by the arrow) configured to receive a voltage or current input. As previously described with respect to FIG. 1A, magnetic field B enhances rightwards-flowing current but dampens leftwards-flowing current. Thus, an output voltage with different polarity will show up in FIG. 1B. Because of the interconnections between contacts 108, 110, 112, 116, 118, and 120 with terminals 124, 126, 128, and 130, $V_{out}$ increases with increasing strength of magnetic field B.

Two additional operating phases are possible. In particular, in a third operating phase, electrical supply is provided at supply terminal 128, and supply terminal 124 is connected to ground. In a fourth operating phase, electrical supply is provided at supply terminal 130, and supply terminal 126 is connected to ground. In each of the third and fourth operating phases, the measured voltage at the signal terminals changes in sign as compared to the first two operating phases. As a result, the signal terminals can be rearranged as well in the third and fourth operating phases. A spinning scheme can be implemented that operates various Hall effect structures in different operating phases either sequentially or in a scrambled random or semi-random order.

The connections between the contacts on the Hall effect regions are not changed during spinning. Thus, in some embodiments, the terminals can be connected to the contacts by hard wiring of interconnect layers. In alternative embodiments, Hall effect regions 114 and 122 could be a single contiguous Hall effect region, rather than two separate portions. In such embodiments, it can be desirable to include a decoupling feature between adjacent Hall effect structures, such as a well having opposite doping as the surrounding semiconductive material. In other embodiments, such as the embodiment shown in FIGS. 3 and 4, below, the contacts of the Hall effect regions and/or structures can be arranged such that a decoupling region is unnecessary, as previously described, depending on spacing within the semiconductor tub, for example.

In the embodiment shown in FIG. 2A, sensor system 200 is depicted. Sensor system 200 includes substrate 202, which supports four 3-contact Hall effect structures 204, 205, 206, and 207. Hall effect structures 204-207 each include three of contacts 208-221 in or close to the top surface 203 of substrate 202. Various connections can be made between each of the contacts 208-221 and terminals 224, 226, 228, and 230, such as those described below. In the embodiment shown, terminal 224 comprises one of the supply terminals, terminal 226 comprises a first output voltage node, terminal 228 comprises the other supply terminal, and terminal 230 comprises a second output voltage node. The voltage difference between the two output voltage nodes, 226 and 230, is depicted as $V_{out}$, and can be used to ascertain the magnitude of magnetic field B acting on sensor system 200 and pointing into the page, in the embodiment depicted in FIG. 2A.

Hall effect structures 204 and 206 are substantially similar to Hall effect structures 104 and 106 of FIGS. 1A-1B. For clarity and simplicity of comparison, the reference numbers assigned to the components of Hall effect structures 204 and 206 are simply iterated by 100 from their counterparts in FIGS. 1A-1B. As such, Hall effect structure 204 includes contacts 208, 210, and 212 positioned in Hall effect region 214; and Hall effect structure 206 includes contacts 216, 218, and 220 positioned in Hall effect region 222.

It should further be noted that Hall effect structures 204 and 206 are interconnected with terminals 224, 226, 228, and 230 in a substantially similar fashion to the interconnections previously described with respect to Hall effect structures 104 and 106 of FIG. 1B. In operation, electrical supply can be provided via terminal 224 to contacts 208 and 220, just as electrical supply was provided from supply terminal 124 to contact 108 in the embodiment shown with respect to FIGS. 1A-1B. Contacts 212 and 216 can be connected to supply terminal 228, which can in turn be connected to ground or another constant voltage, just as contacts 112 and 116 were connected to supply terminal 128, which was connected to ground in the embodiment shown in FIGS. 1A-1B. Reference voltage $V_{out}$ can be measured between terminals 226 and 230, which are connected to contacts 210 and 218, just as reference voltage $V_{out}$ was measured between terminals 110 and 118 with respect to the embodiment shown in FIGS. 1A-1B.

Despite the similarities described above, the embodiment shown in FIG. 2A is different from the embodiments previously described with respect to FIGS. 1A and 1B in that it includes additional Hall effect structures. In particular, the embodiment shown in FIG. 2A includes Hall effect structures 205 and 207. Hall effect structures 205 and 207 can be interconnected in a substantially similar fashion to the interconnections previously described with respect to Hall effect structures 106 and 104, respectively, and as shown in FIGS. 1A and 1B. Hall effect structures 204-207 can be spun, a process in which the functions assigned to each of the terminals is changed to correspond to a variety of operating phases. In each operating phase, at least one of terminals 224, 226, 228, and 230 is associated with each of two functions: supply, and signal. In various embodiments, the supply function (shown in FIG. 2A associated with terminal 224, which will be referred to as a "supply terminal" for purposes of this embodiment) can be either a voltage supply or a constant current supply. Additionally, supply terminal 228 can be a connection to ground or a constant voltage in various embodiments. The two supply terminals 224 and 228 provide electrical current through the Hall effect regions 214, 215, 222, and 223.

Current can be injected from supply terminal 224 to contact 219, just as current was injected from terminal 126 to contact 110. Contact 211 can be connected to supply terminal 228, which can in turn be connected to ground or a constant voltage, just as terminal 118 was connected to terminal 130 and ground. As shown in FIG. 2A, contacts 209 and 221 are connected to signal terminal 226, which comprises a first output voltage node, and contacts 213 and 217 are connected to signal terminal 230, which comprises a second output voltage node. Similarly, with respect to the embodiment previously shown in FIGS. 1A-1B, contacts 120 and 108 were connected to terminal 124, which formed a first voltage node, and contacts 116 and 112 were connected to terminal 128, which formed a second voltage node.

The connections described throughout the application are shown as direct electrical connections in the accompanying figures. In other embodiments, the connections could be more complex and/or indirect than the connections shown. For example, various interconnections, vias, band pass filters, or rectifiers, among other features, could be present between the contacts, terminals, voltage/current sources, ground, and/or output nodes described throughout the specification. Connections, as described throughout the application, refer to any direct or indirect electrical connection, so long as it is not through one of the Hall effect regions shown in the figures. So, for example, contact 208 of FIG. 2A is connected to source terminal 224, but not to contact 210.

As previously described with respect to FIGS. 1A and 1B, Hall effect structures 104 and 106 can be operated in two or more operating phases sequentially. For example, a first phase was depicted in FIG. 1A, and a second phase was depicted in FIG. 1B. In the embodiment shown in FIG. 2A, both operating phases are used simultaneously. While Hall effect structures 204 and 206 operate in the second operating phase previously described, Hall effect structures 205 and 207 operate in the first operating phase simultaneously. As previously described with respect to FIGS. 1A and 1B, third and fourth operating phases are also possible. Spinning between a subset of these phases, whereby the current source, ground, and output voltage couplings are interchanged between terminals 224, 226, 228, and 230, produces redundant measurements of the magnetic field as measured through different current paths. The outputs of these several redundant measurements can be used to compensate for raw offsets.

Figure 2B:
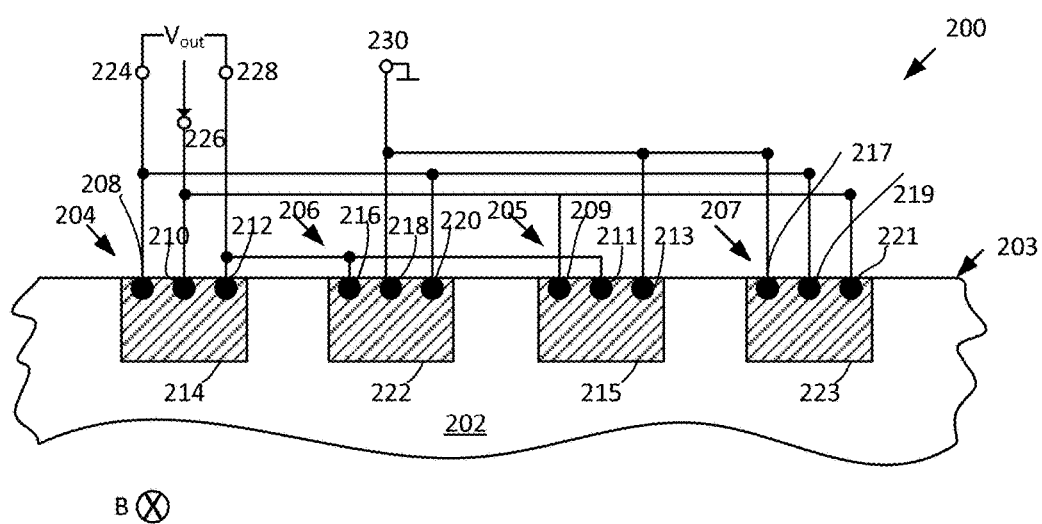

FIG. 2B shows sensor system 200 of FIG. 2A, but terminals 224, 226, 228, and 230 have been reconfigured to operate Hall effect structures 204-207 in another operating phase configuration. As shown in FIG. 2B, Hall effect structures 204 and 206 operate in the first operating phase (previously described with respect to FIG. 1A), while Hall effect structures 205 and 207 operate in the second operating phase (previously described with respect to FIG. 1B).

In effect, sensor system 200 includes two sensor pairs. The first Hall effect structure pair, including Hall effect structures 204 and 206, operates in one operating phase configuration, while the second Hall effect structure pair, including Hall effect structures 205 and 207, operates in another operating phase configuration. The outputs of these two sensor pairs are combined at terminals 224, 226, 228, and 230. By spinning at the terminals 224, 226, 228, and 230, for example between the arrangements shown in FIGS. 2A and 2B, each Hall effect structure pair is spun as well.

Figure 2C:
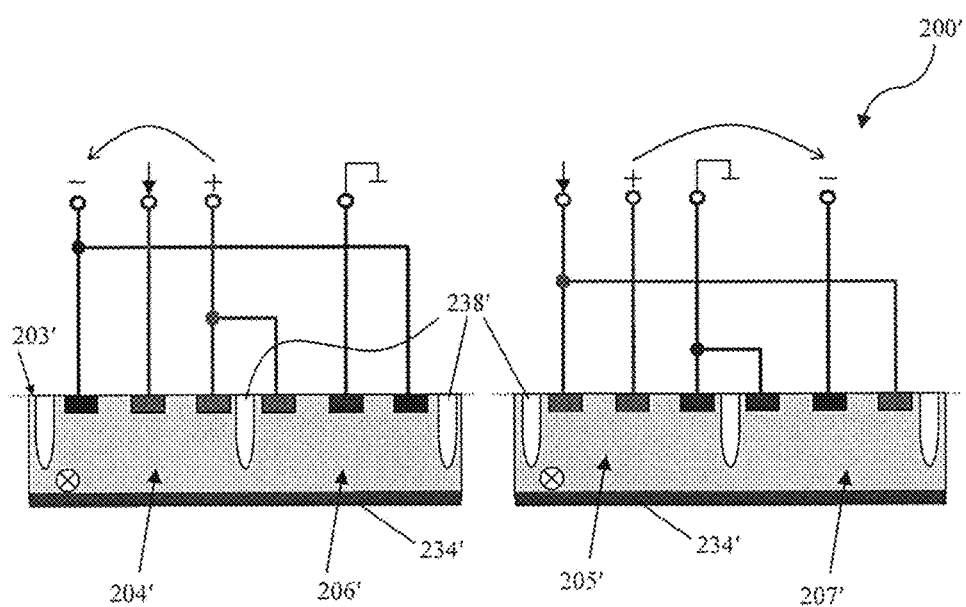
FIG. 2C is a cross-sectional view of a system according to an embodiment that includes four Hall effect structures in first and operating phases, respectively, as well as buried layers and decoupling regions.

FIG. 2C depicts sensor system 200', which includes interconnected Hall effect structures 204'-207'. Hall effect structures 204'-207' are interconnected in much the same way as previously described and shown with respect to FIGS. 2A-2B. However, in the system 200' shown in FIG. 2C, the Hall effect structures 204'-207' are separated from one another by decoupling regions 238' arranged along the surface 203' on which Hall effect structures 204'-207' are arranged. Furthermore, the Hall effect structures operating within a common operating phase (e.g., Hall effect structure 204' and Hall effect structure 206', or Hall effect structure 205' and Hall effect structure 207') are at least partially interconnected with one another via buried layers 234'.

Figure 3:
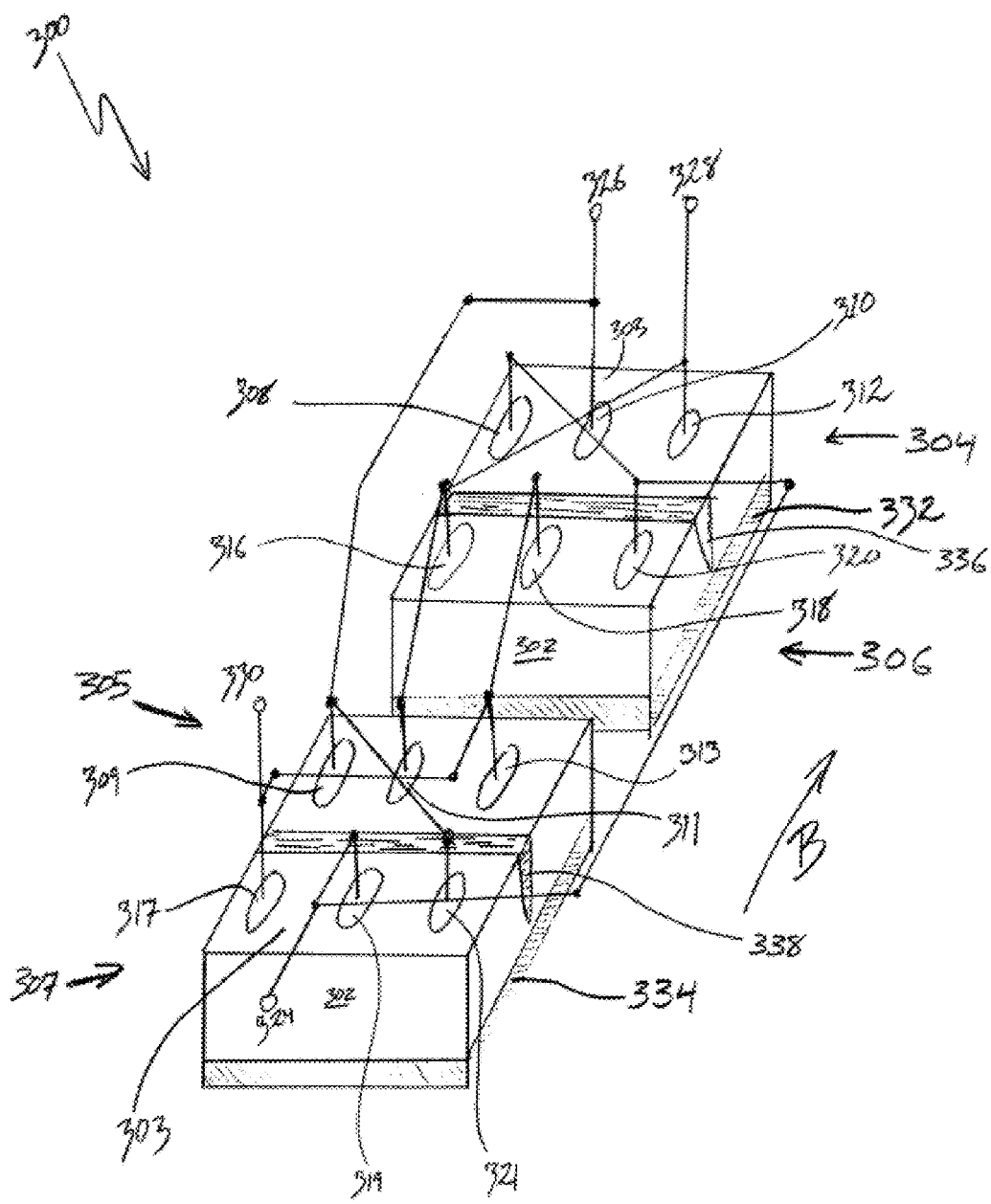
FIG. 3 is a perspective view of a device according to an embodiment having two Hall effect structures and buried layers.

FIG. 3 is a perspective illustration of sensor system 300, according to one embodiment. Sensor system 300 is a structure capable of measuring magnetic field B. Sensor system 300 includes similar components to those described with reference to the embodiments shown in FIGS. 1A-1B and 2A-2C. For that reason, similar reference numerals, iterated by multiples of 100, have been used where appropriate to indicate those features that are similar.

In addition to components similar to those previously described with respect to other embodiments, sensor system 300 includes buried layers 332 and 334. In the embodiment shown in FIG. 3, buried layers 332 and 334 are highly conductive regions of semiconductive material in ohmic contact with the edge of Hall effect structure 304 furthest away from the contacts. In operation, in some embodiments, buried layers 332 and 334 promote current flow along the layer (i.e., perpendicular to the "depth" of the Hall effect region 304, and parallel to the plane in which the contacts are arranged. In semiconductor technology the term "buried layer" is used in a very limited way (linked to a certain semiconductor manufacturing flow) and it should be understood that in the context of this patent application we use the term in a broader sense, meaning that there is a layer beneath a first semiconductor surface that makes up the Hall effect region 304, comprising the contacts of electronic devices. Such a layer may be produced by growing it onto a base substrate and adding additional layers above it or by implanting a large concentration dose with very high kinetic energy into a substrate such that the peak of the doping profile is below the surface of the final substrate. Such a buried layer can be unpatterned, meaning that it extends across the entire substrate or at least across the entire chip after singulating it from the substrate; yet it can also be patterned, meaning that it there are at least two or three or thousands of separate islands of this layer on a single chip.

Sensor system 300 also comprises decoupling portions 336 and 338. Decoupling portions 336 and 338 can be doped with an opposite-sign dopant than the Hall effect regions. For example, if Hall effect structure 304 includes an n-type Hall effect region, then decoupling portions 336 can be p-type, and vice versa. Charge carriers will not travel through decoupling portions 336 and 338, further promoting current flow downwards, and preventing unwanted cross-coupling between Hall effect structures 304 and 306 (for decoupling portion 336) and Hall effect structures 305 and 307 (for decoupling portion 338).

It should be understood that the positioning of buried layers 332 and 334, as well as decoupling portions 336 and 338, is not limited to the arrangements shown in FIG. 3. Various other arrangements are possible that also cause current flow to be routed further from the surface 303 along which the contacts of each embodiment are arranged. For example, decoupling features could be arranged between contacts 110 and 112, as well as 118 and 120, of FIGS. 1A-1B. A buried layer can also be included at the base of each of Hall effect regions 114 and 122 (i.e., at the portion of Hall effect regions 114 and 122 opposite from contacts 108, 110, 112 and 116, 118, 120). Similarly, decoupling features could be arranged between contacts 210 and 212, as well as 218 and 220, as well as 211 and 213, as well as 219 and 221, of FIGS. 2A-2B. Additionally or alternatively, buried layers could be added at the base of each Hall effect region 214, 215, 222, and 223. Furthermore, the arrangement of the contacts of various embodiments can differ to promote desired current flow patterns.

Figure 4:
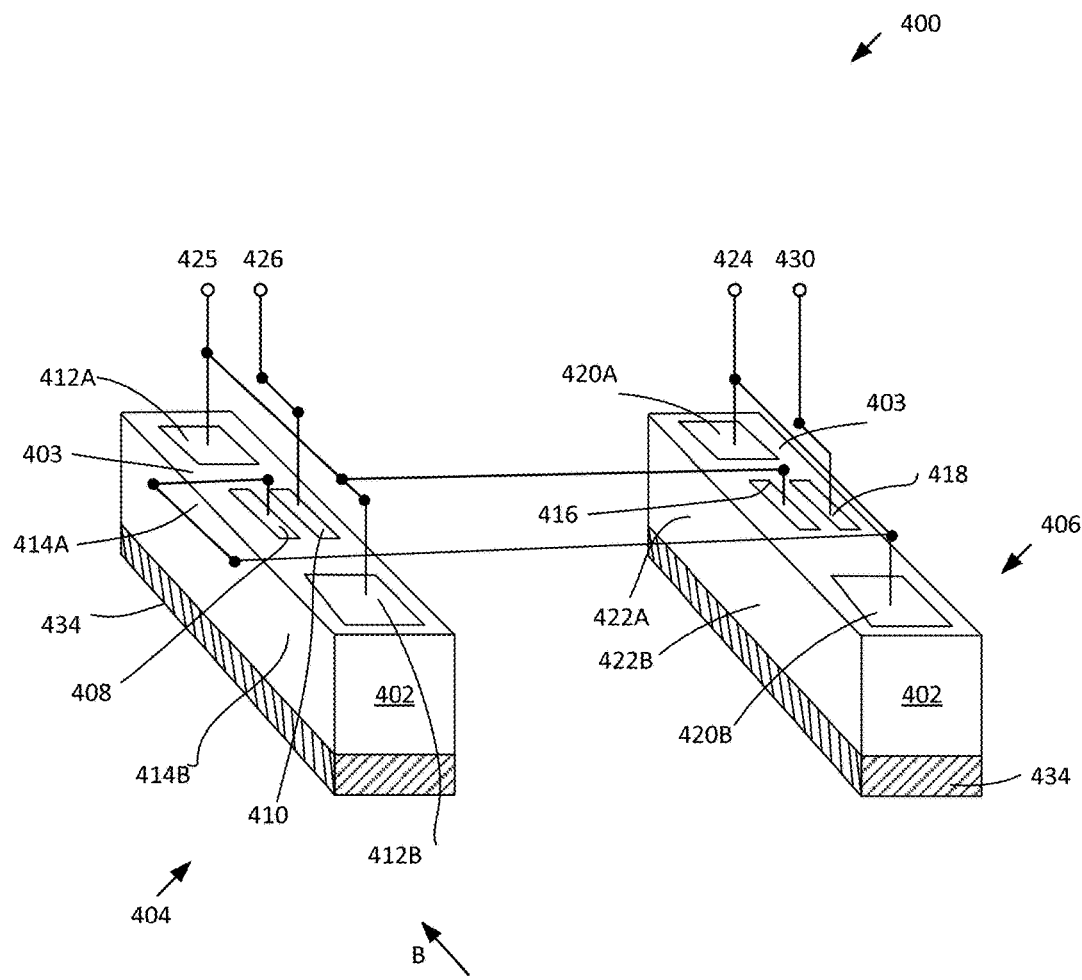
FIG. 4 is a perspective view of a system according to an embodiment that includes four Hall effect structures.

FIG. 4 is a perspective view of sensor system 400, according to another embodiment. Sensor system 400 includes Hall effect structures 404-407. Hall effect structures 404 and 406 are not necessarily positioned within the same substrate. Hall effect structures 404 and 406 are shown in alignment in FIG. 4, such that they both detect magnetic field components toward the back of the page, as indicated by magnetic field B. This arrangement is used for simplicity of comparison with previously described embodiments. Because Hall effect structures 404 and 406 are not necessarily arranged within a common substrate, however, in alternative embodiments they could be configured at any desired angle relative to one another. For example, Hall effect structure 404 could detect fields having a component towards the back of the page while Hall effect structure 406 could be rotated by 90 degrees to detect magnetic field components having a component towards the right side of the page.

Sensor system 400 of FIG. 4 includes similar components to those described with reference to the embodiments shown in FIGS. 1A-1B, 2A-2B, and 3. For that reason, similar reference numerals, iterated by multiples of 100, have been used where appropriate to indicate those features having similar functions. However, Hall effect structures 404 and 406 are vertical Hall effect structures having a different contact arrangement than those shown with reference to previous embodiments. Furthermore, the embodiment shown in FIG. 4 includes buried layer 434.

Hall effect structure 404 includes contacts 408, 410, 412A, and 412B. Contacts 412A and 412B are electrically coupled with one another at a common electrical potential, and are essentially two halves of the same contact. Contact 412A is positioned across Hall effect region 414A from contacts 408 and 410, while contact 412B is positioned across Hall effect region 414B from contacts 408 and 410. Optionally, in other embodiments, one of contacts 412A and 412B could also be removed. Optionally, in still further embodiments, one of contacts 420A and 420B could also be removed. If any of contacts 412A, 412B, 420A, 420B is removed, the associated Hall effect region 414A, 414B, 422A, 422B can also optionally be removed. One or both of highly conductive bottom layers 434 and 434 can also be removed, in embodiments.

Similarly, Hall effect structure 406 includes contacts 416, 418, 420A, and 420B, and contacts 420A and 420B are electrically coupled to form two halves of the same contact. Contact 420A is positioned across Hall effect region 422A from contacts 416 and 418, and contact 420B is positioned across Hall effect region 422B from contacts 416 and 418.

Contact 408 is electrically coupled to the bifurcated contacts 420A and 420B, and all three contacts are connected to terminal 424. Contact 410 is connected to terminal 426. Bifurcated contacts 412A and 412B are electrically coupled to contact 416, and all three contacts are connected to terminal 428. Contact 418 is connected to terminal 430. Notably, these interconnections are congruent to those previously described with respect to the embodiments shown in the previous embodiments. As such, terminals 424, 426, 428, and 430 can be used to operate Hall effect structures 404 and 406 in any of the four previously described operating phases. Further, spinning of the connections to terminals 424, 426, 428, and 430 can be used to alternate the phases in which each of Hall effect structures 404 and 406 operates.

Contacts 408, 410, and 412A-B are arranged non-linearly. That is, unlike conventional vertical Hall cells, the contacts are not distributed along a line along the surface 403 of the associated substrate (in this embodiment, substrate 402) and perpendicular to the direction of the magnetic field to be measured (in this embodiment, magnetic field B). Instead, contacts 408, 410, and 412A-412B are positioned in an elongated diamond arrangement. Contacts 416, 418, and 420A-420B are positioned in a similar arrangement. Buried layer 434 promotes current flow perpendicular to the direction of magnetic field B, rather than lateral current flow between contacts 408, 410, and 412A-412B within Hall effect structure 404 and contacts 416, 418, and 420A-420B within Hall effect structure 406. Lateral current flow between the contacts of each Hall effect structure can be affected less (if at all) by applied magnetic fields. Furthermore, current flow through buried layer 434 provides high signal output from system 400 at moderate to low power dissipation, even compared to the losses associated with wire-based systems.

Figure 5:
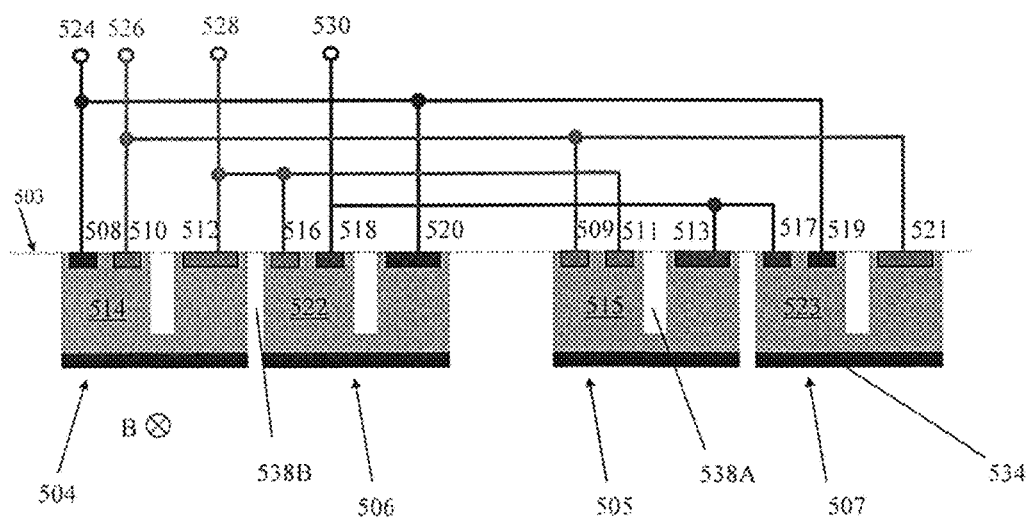
FIG. 5 is both a cross-sectional and a symbolic shorthand view of a system according to one embodiment that includes four Hall effect structures, as well as decoupling regions and buried layers.

FIG. 5 is a cross-sectional or simplified cross-sectional illustration of a system that includes parts similar to those previously described. FIG. 5 shows four Hall effect structures (504-507) each Hall effect structure comprising three of contacts (508-513, 516-521) and one of Hall effect regions (514, 515, 522, 523). The terminals (524, 526, 528, and 530) shown in FIG. 5 are interconnected with the contacts (508-513, 516-521) of FIG. 5 in a substantially similar fashion as previously described with respect to the embodiments previously described with respect to FIGS. 2A, 2B, 3, and 4. As such, the system shown in FIG. 5 can be operated in two phases simultaneously by providing either a current or voltage supply via two supply terminals and measuring an output signal at two output terminals. Furthermore, the system shown in FIG. 5 is symmetrized. That is, the internal resistance through the system is nominally the same in either operating phase, in the absence of an applied magnetic field. By "nominally the same," we mean that without process spread, the resistances are identical. A nominal difference in resistance of a few percent still results in a functional system. In some embodiments, the doping profiles are inhomogeneous, and can vary as a function of the depth coordinate. Such a doping profile can be measured, yet only if the device is large (typically about 100 μm×100 μm in lateral size). If the device is smaller, the profile versus depth depends also on the lateral dimensions. Therefore it is not possible to measure the profile accurately enough to predict the resistance with up to 1% accuracy. Alternatively one may use a process calculation (numerical FEM) to predict the doping profile, yet this also is not necessarily accurate up to 1% in resistance.

The embodiment shown in FIG. 5 includes decoupling regions 538A and 538B, and buried layers 534. Decoupling regions 538A are positioned within Hall effect structures and between contacts, whereas decoupling regions 538B are positioned between adjacent Hall effect structures. Decoupling regions 538A are positioned to promote current flow within the Hall effect regions (514, 515, 522, 523) from the surface 503 of the substrate into the depth. At the bottom of the Hall effect regions (514, 515, 522, 523) there may be a highly conductive layer (e.g. a buried layer) 534 as shown in FIG. 5, yet this is optionally and in other embodiments there may be no highly conductive layer at the bottom of the Hall effect regions. By routing the current flow further in a direction perpendicular to an expected direction of magnetic field B, the Hall voltage is affected and the sensitivity of the overall system is increased. Furthermore, routing current flow within a desired region (for example by blocking off potential current paths using decoupling regions 538A) reduces the needed current flow to achieve a particular sensitivity, and thus reduces the power draw of an associated sensor system.

FIG. 5 can be interpreted as a simple cross-sectional view, but is a simplified schematic of a variety of 3-dimensional Hall systems and structures. In this more general interpretation, each Hall structure has a Hall effect region comprising two contacts, and a third contact is decoupled from this Hall effect region. The decoupling can be one-dimensional (as shown in FIG. 5) or three-dimensional.

Figure 6:
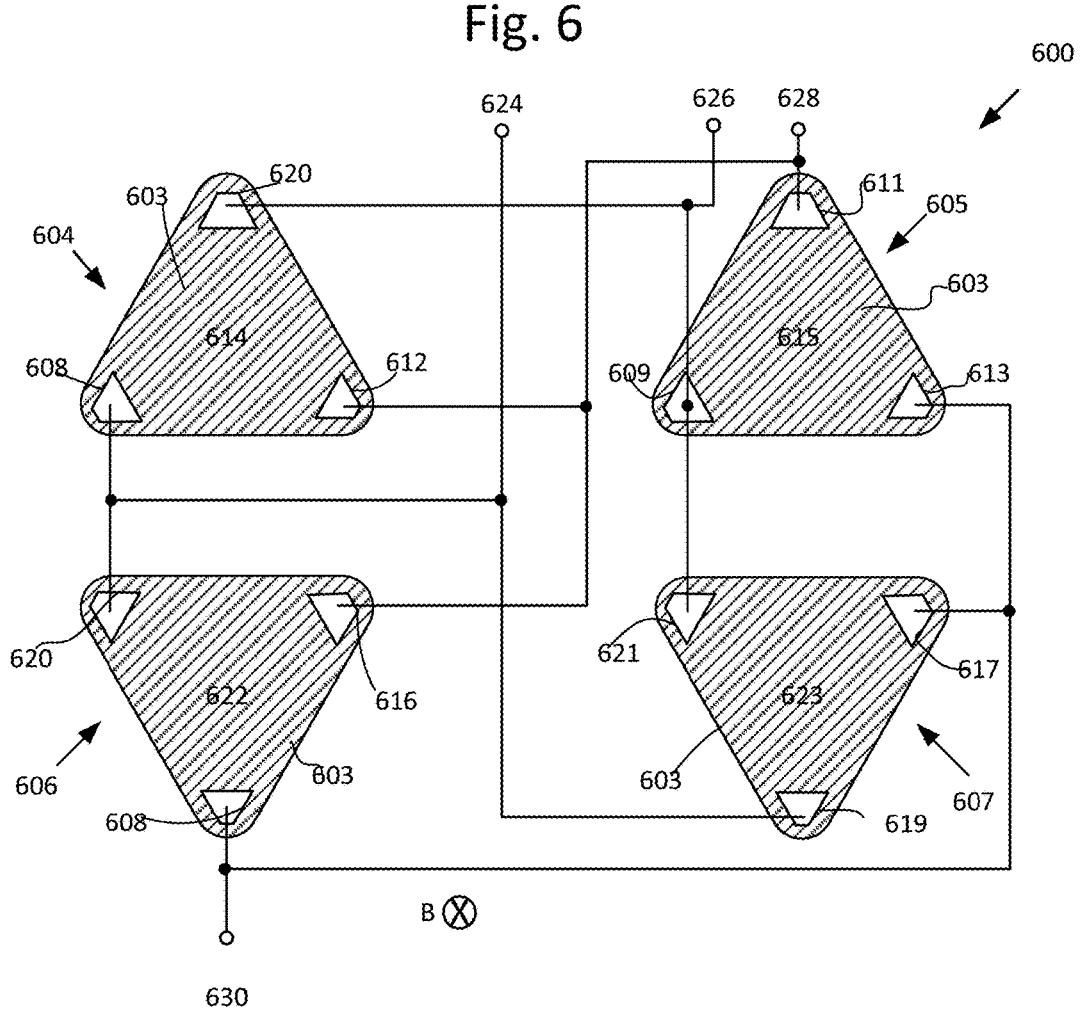
FIG. 6 is a top view or layout view of an arrangement comprising four Hall effect structures, each structure being a three-contact horizontal Hall effect device, according to an embodiment.

FIG. 6 is a schematic plan view of sensor system 600, which is connected in a similar fashion to the embodiments previously described. Unlike any of the previous embodiments, sensor system is comprised of horizontal Hall effect devices rather than vertical Hall effect devices. In particular, sensor system 600 includes horizontal Hall effect devices 604-607. Horizontal Hall structures can include a relatively thin Hall effect region, as compared to vertical Hall devices previously described. The typical lateral size of a horizontal Hall effect structure is often between about 10 μm and about 200 μm, with an overall thickness between about 0.3 μm and about 7 μm. Often, the thickness is at least 10 times smaller than the lateral size.

Each of the horizontal Hall effect structures 604-607 are interconnected in a similar fashion to that previously described with respect to the embodiments shown in FIGS. 2A-2B and 3. In particular, horizontal Hall effect structure 604 includes three contacts (608, 610, and 612) separated by a Hall effect region 614. Likewise, horizontal Hall effect structure 606 includes three contacts (616, 618, and 620) separated by Hall effect region 622, horizontal Hall effect structure 605 includes three contacts (609, 611, and 613) separated by Hall effect region 615, and horizontal Hall effect structure 607 includes three contacts (617, 619, and 621) separated by Hall effect region 623.

Each of the contacts (608-613, 616-621) and the Hall effect regions (614-615, 622-623) are arranged along the surface 603 of their respective horizontal Hall effect structure (604-607) that is visible in the plan view illustrated in FIG. 6. Unlike a vertical Hall effect sensing structure, current flow in a horizontal Hall effect sensing structure is primarily along the surface 603. As a magnetic field is applied orthogonal to surface 603, for example magnetic field B, current that is injected at one contact of the Hall effect structure (e.g., contact 608 of Hall effect structure 604) will preferentially flow to one of the other two contacts (e.g., to either contact 610 or 612). As the magnitude of magnetic field B is increased, and the Lorentz force on charge carriers increases, this preferential flow will intensify.

As shown in FIG. 6, terminals 624, 626, 628, and 630 are connected to contacts 608-613, 616-621 in a similar pattern to that described previously with respect to FIGS. 2A-2B. By spinning those terminals between the four operating phases previously described, accurate measurements of the magnetic field B can be made and two of sensors 604-607 will always be operating in the first phase or the second phase.

Due to the symmetry of the horizontal Hall effect structures 604-607, the internal resistances are theoretically identical in both operating phases. Actual Hall effect sensing structures, however, may have slightly different resistances related to manufacturing tolerances or other variables. Thus, a symmetrization like that shown with respect to the vertical Hall cells of the previous embodiments is not strictly necessary, and in other embodiments other configurations could be used. However, the embodiment shown in FIG. 6 does symmetrize the contact placement, which can reduce asymmetries between horizontal and vertical directions caused by mechanical stress on the sensors.

Contacts 608, 610, and 612 of Hall effect structure 604 are arranged non-linearly, in a triangular fashion. Similarly, contacts 616, 518, and 620 are arranged in a triangular fashion on Hall effect structure 606, contacts 609, 611, and 613 are arranged in a triangular fashion on Hall effect structure 605, and contacts 617, 619, and 621 are arranged in a triangular fashion on Hall effect structure 607. As such, the contacts 608-613, 616-621 are not arranged along a straight line.

In an embodiment, a Hall effect structure is configured to be responsive to a magnetic field. The Hall effect structure can comprise: at least four Hall effect regions electrically at least partially decoupled from one another, each of the four Hall effect regions comprising three contacts; and at least four terminals, wherein each of the terminals are permanently electrically connected to the same number of contacts as the others, and wherein no two terminals are connected to the same contact, and wherein no two contacts of the same Hall effect region are connected to the same terminal. The first terminal is not connected to any of the three contacts of the first Hall effect region, the second terminal is not connected to any of the three contacts of the second Hall effect region, the third terminal is not connected to any of the three contacts of the third Hall effect region, and the fourth terminal is not connected to any of the three contacts of the fourth Hall effect region. The connections are configured such that in the absence of magnetic field the resistance between a first set of two of the terminals is nominally identical to the resistance between a second set comprising the other two terminals of the arrangement.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of Section 112, sixth paragraph of 35 U.S.C. are not to be invoked unless the specific terms "means for" or "step for" are recited in a claim.

I claim:

1. A method of sensing a magnetic field, the method comprising:
   operating a sensor system in a first operating phase, the sensor system comprising:
      a first Hall effect structure comprising first, second, and third contacts arranged adjacent to a first surface of a first Hall effect region; and
      a second Hall effect structure comprising fourth, fifth, and sixth contacts arranged adjacent to a second surface of a second Hall effect region;
   wherein operating the sensor system in the first operating phase comprises:
      causing current to flow between a first terminal and a second terminal, wherein:
         the first terminal is connected to the first and sixth contacts; and
         the second terminal is connected to the third and fourth contacts;
      sensing a first output signal at a third terminal connected to the second contact, and wherein the third terminal is not connected to any of the fourth, fifth, and sixth contacts of the second Hall effect region;
      sensing a second output signal at a fourth terminal connected to the fifth contact;
      generating a first operating phase output signal related to the first output signal and the second output signal;
   operating the sensor system in a second operating phase comprising:
      causing current to flow between the third and fourth terminals; and
      generating a second operating phase output signal related to a third output signal sensed at the first terminal and a fourth output signal sensed at the second terminal; and
   combining the first operating phase output signal and the second operating phase output signal to generate a sensor output signal.

2. The method of claim 1, wherein the first and second Hall effect structures are horizontal Hall effect structures.

3. The method of claim 1, wherein the first and second Hall effect structures are vertical Hall effect structures.

4. The method of claim 3, wherein the third and sixth contacts are bifurcated.

5. The method of claim 1, wherein the sensor system further comprises:
   a third Hall effect structure comprising seventh, eighth, and ninth contacts arranged adjacent to a third Hall effect region;
   a fourth Hall effect structure comprising tenth, eleventh, and twelfth contacts arranged adjacent to a fourth Hall effect region;
   the first terminal is further connected to the eleventh contact;
   the second terminal is further connected to the eighth contact;
   the third terminal is further connected to the seventh and twelfth contacts; and
   the fourth terminal is further connected to the ninth and tenth contacts.

6. The method of claim 5, wherein the first, second, third, and fourth Hall effect structures are vertical Hall effect structures.

7. The method of claim 5, wherein the first, second, third, and fourth Hall effect structures are horizontal Hall effect structures.

* * * * *